United States Patent [19]

Isogai

[11] 4,369,502

[45] Jan. 18, 1983

[54] SEMICONDUCTOR MEMORY CIRCUIT

[75] Inventor: Hideaki Isogai, Higashikurume, Japan

[73] Assignee: Fujitsu Limited, Kawasaki, Japan

[21] Appl. No.: 179,900

[22] Filed: Aug. 20, 1980

[30] Foreign Application Priority Data

Aug. 22, 1979 [JP] Japan .................................. 54-106901

[51] Int. Cl.³ .......................... G11C 11/40; G11C 7/00
[52] U.S. Cl. ..................................... 365/155; 365/179; 365/190
[58] Field of Search ................ 365/155, 190, 203, 179

[56] References Cited

U.S. PATENT DOCUMENTS

| 4,156,941 | 5/1979 | Homma et al. | 365/189 |
|---|---|---|---|
| 4,164,791 | 8/1979 | Homma | 365/190 |
| 4,168,490 | 9/1979 | Stinehelfer | 365/204 |
| 4,168,539 | 9/1979 | Anderson | 365/155 |

Primary Examiner—James W. Moffitt

Attorney, Agent, or Firm—Staas & Halsey

[57] ABSTRACT

A semiconductor memory circuit, comprising memory cells; word lines, hold lines and bit lines connected to respective memory cells; and a hold-current controlling circuit. The hold-current controlling circuit comprises identical controlling circuit elements connected to respective hold lines and a constant-current source commonly connected to the controlling circuit elements. Each of the controlling circuit elements comprises means for absorbing electric charges from respective hold lines, when corresponding word lines change from a selection status to a non-selection status, until the voltage level of the hold line reaches a full "L" or "H" level, and means for blocking a flow of electric charges from the hold line, when a corresponding word line changes from a non-selection status to a selection status, during a predetermined interval after time data switching from one memory cell to another memory cell is performed.

5 Claims, 10 Drawing Figures

SEMICONDUCTOR MEMORY CIRCUIT

BACKGROUND OF THE INVENTION

The present invention relates to a semiconductor memory circuit and, more particularly, to a hold-current controlling circuit mounted therein.

Generally, a semiconductor memory circuit is mainly comprised of a large number of memory cells. The memory cells are arranged at cross points of word lines and bit lines. A desired memory cell is selected by both a word decoder, connected to the word lines, and a bit decoder, connected to the bit lines, at the ends thereof. Data to be read is produced from the other end of the corresponding bit line to which the selected memory cell is connected, after data to be written is supplied to the memory cell.

Each memory cell is usually connected not only to a word line but also to a hold line through which the above mentioned hold current flows. The hold current functions to sustain the data stored in the memory cells. The hold current is absorbed by a hold-current source. It should be noted that the hold-current source absorbs a discharge current, too. The discharge current is created by electric charges held by a parasitic capacitor of the memory cells and also by a stray capacitor distributed along the word line. The more the discharge current is absorbed by the hold-current source, the higher the accessing speed of the memory cells becomes. Accordingly, in order to absorb the discharge current very quickly, a hold-current controlling circuit as described above has been proposed. The hold-current controlling circuit cooperates with the hold-current source and absorbs not only the hold current but also the above-mentioned discharge current created by the electric charges held by the capacitors.

Many types of hold-current controlling circuits have been proposed and put into practical use. However, all of the prior art hold-current controlling circuits have an identical disadvantage in that, although each of these hold-current controlling circuits is effective for achieving a high speed accessing operation with respect to a word line which changes from a selection status to a non-selection status, the hold-current controlling circuits are not effective for achieving a high speed accessing operation with respect to a word line which changes from a non-selection status to a selection status. The term selection status means a condition in which a word line is being selected by a word decoder, while the term non-selection status means a condition in which a word line is not being selected by the word decoder.

SUMMARY OF THE INVENTION

Therefore, it is an object of the present invention to provide, in a semiconductor memory circuit, a hold-current controlling circuit which is effective for achieving a high speed accessing operation with respect to both a word line which changes from a selection status to a non-selection status and a word line which changes from a non-selection status to a selection status.

BRIEF DESCRIPTION OF THE DRAWINGS

The present invention will be more apparent from the ensuing description with reference to the accompanying drawings wherein.

DETAILED DESCRIPTION OF THE PREFERRED EMBODIMENT

Figure 1:
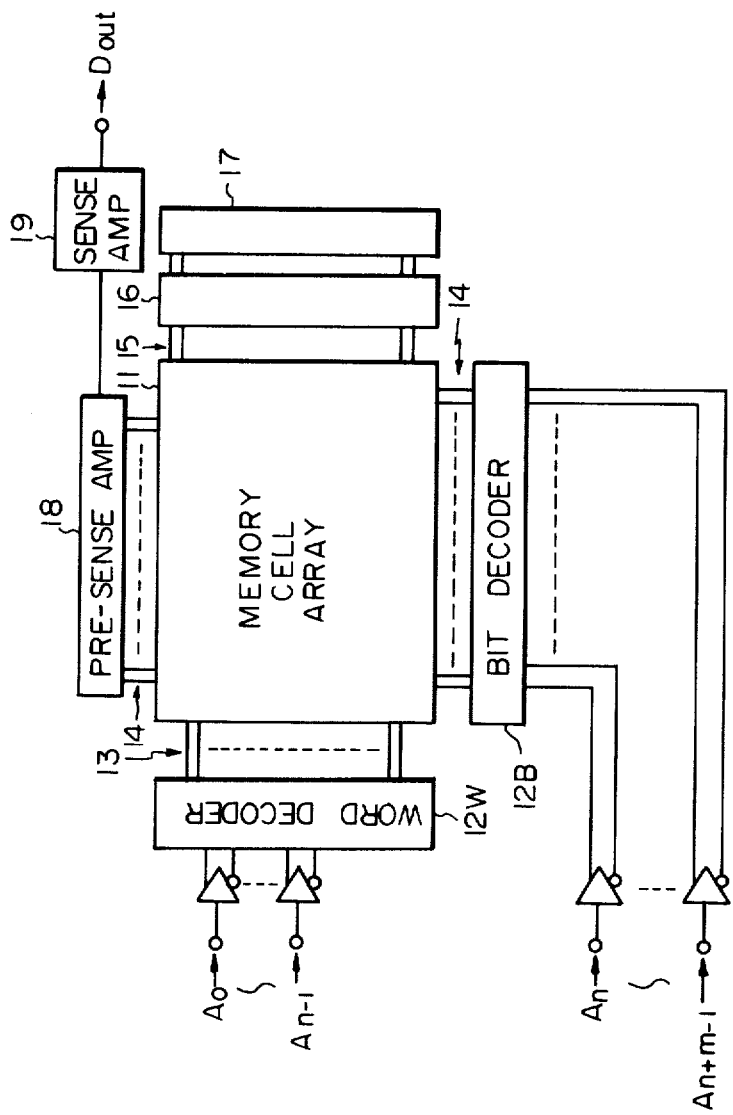
FIG. 1 schematically illustrates an arrangement of a conventional semiconductor memory circuit.

In FIG. 1, which schematically illustrates an arrangement of a conventional semiconductor memory circuit, reference numeral 11 represents a memory cell array, comprised of, for example $2^n \times 2^m$ memory cells. One selected memory cell from among the memory cells is accessed by a word decoder 12W and a bit decoder 12B, in accordance with address data ($A_o$ through $A_{n-1}$) and address data ($A_n$ through $A_{n+m}$), respectively. Word lines 13 extend in one direction from the word decoder 12W into the array 11 and bit lines 14 extend from the bit decoder 12B into the array 11. Data D out to be read is produced from a sense amplifier 19 via the corresponding one of the bit lines and a pre-sense amplifier 18.

The memory cell array 11 is connected to a hold-current source 16 via hold lines 15. A hold current flows through the hold lines 15 and is absorbed into the source 16. The source 16 is also useful for absorbing a discharge current created by electric charges held by the parasitic capacitors in the memory cells and the stray capacitor distributed along the word line. In such a case, the discharge current must be absorbed very quickly so as to achieve a high speed accessing operation of the memory cells. In order to achieve this high speed accessing operation, a hold-current controlling circuit 17 is employed in the semiconductor memory circuit. It should be understood that the invention of the present application is specifically directed to the hold-current controlling circuit 17.

Figure 2A:
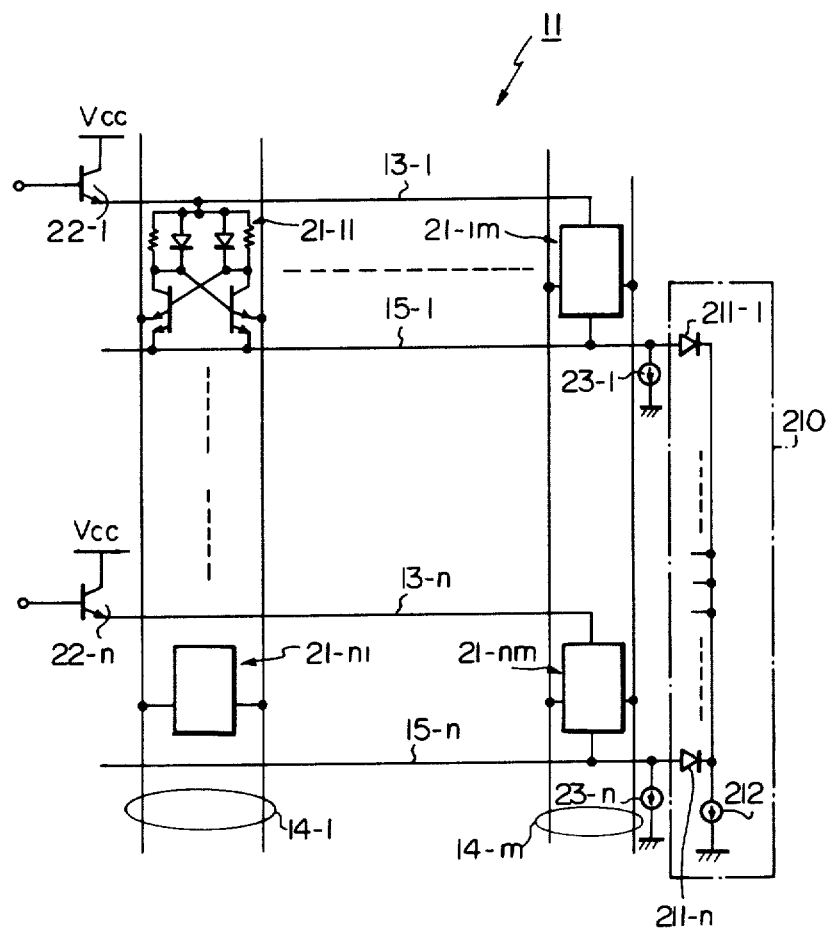
FIG. 2A depicts a circuit diagram of a part of a semiconductor memory device including a first type of prior art hold-current controlling circuit.
Figure 2B:
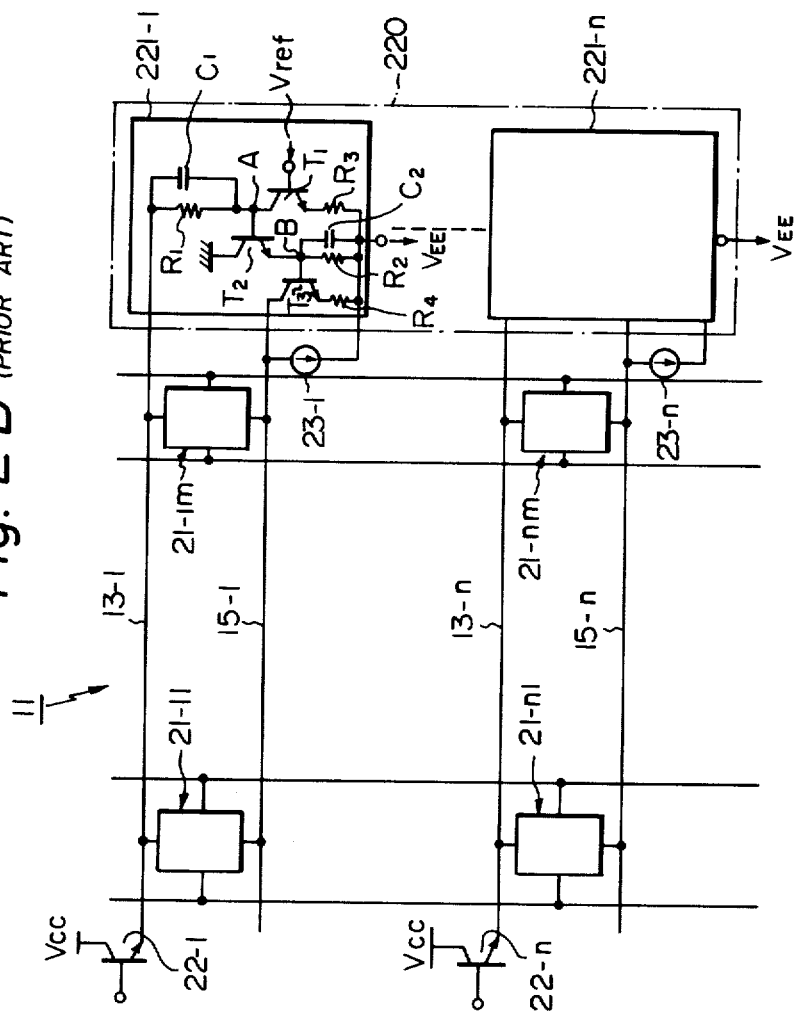
FIG. 2B depicts a circuit diagram of a part of a semiconductor memory circuit including a second type of prior art hold-current controlling circuit.
Figure 2C:
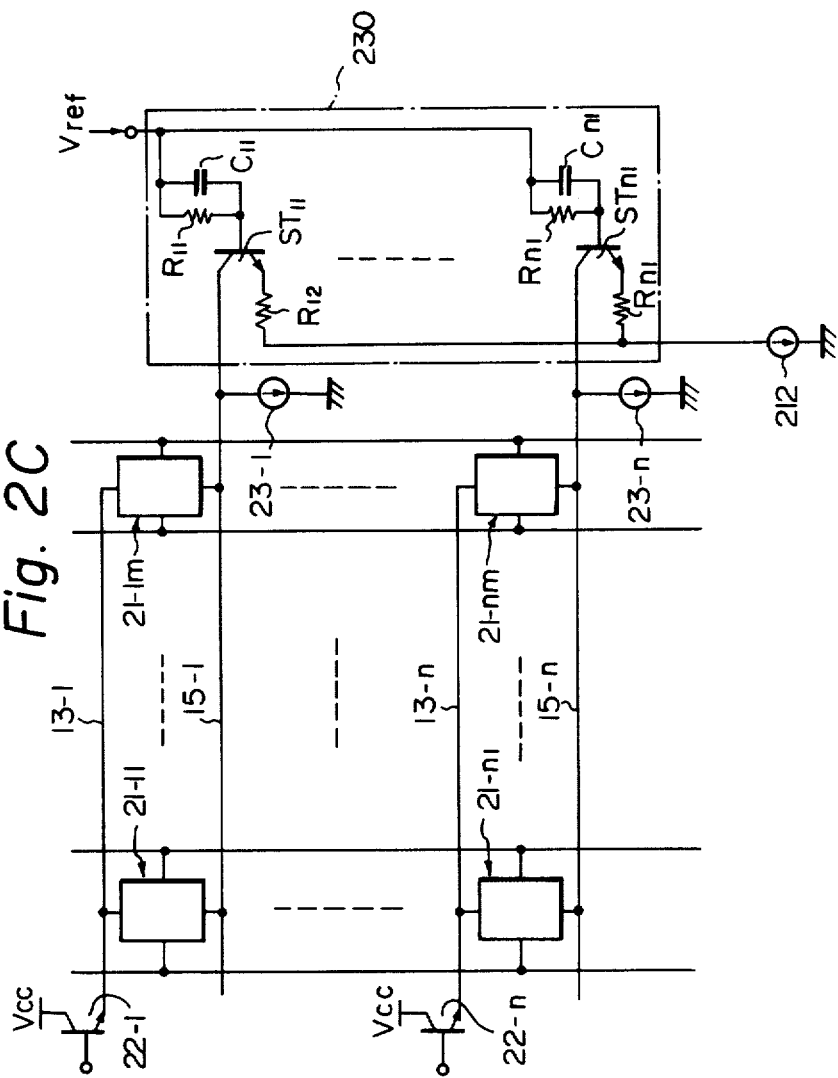
FIG. 2C depicts a circuit diagram of a part of a semiconductor memory circuit including a hold-current controlling circuit according to the present invention.
Figure 3A:
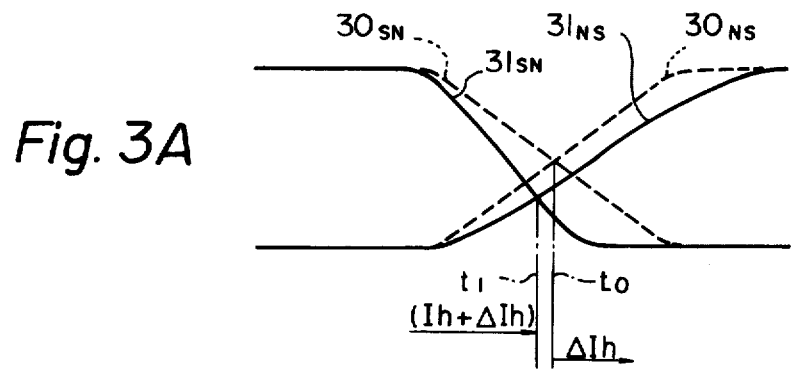
FIG. 3A is a timing graph which illustrates the operation of the circuit illustrated in FIG. 2A.
Figure 3B:
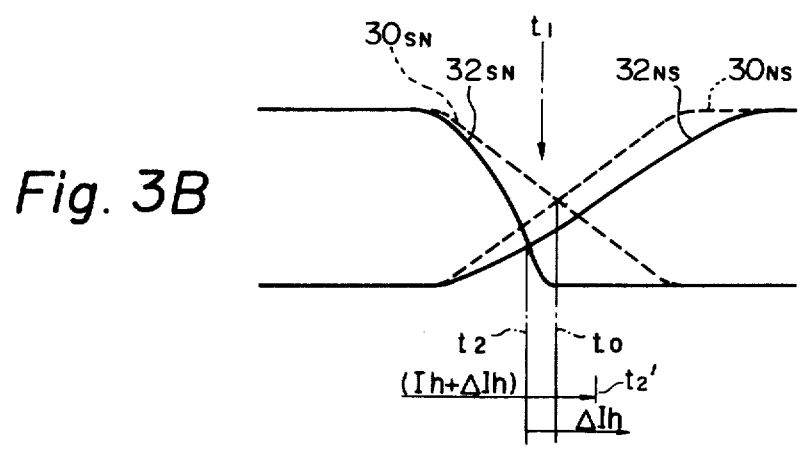
FIG. 3B is a timing graph which illustrates the operation of the circuit illustrated in FIG. 2B.
Figure 3C:
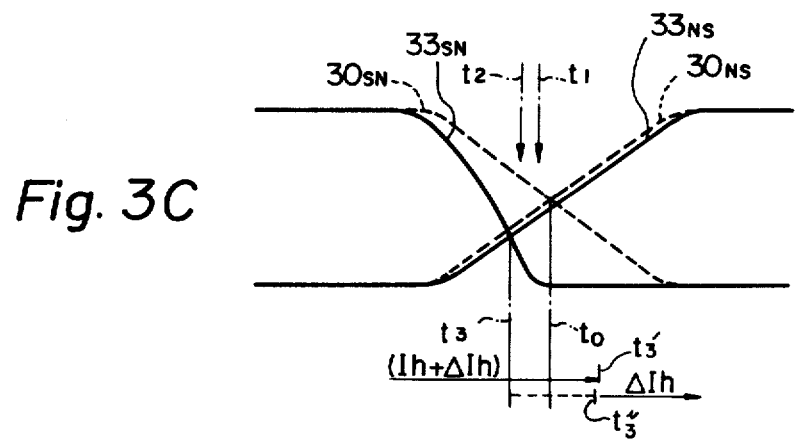
FIG. 3C is a timing graph which illustrates the operation of a circuit shown in FIG. 2C.

In the prior art two-types of hold-current controlling circuits have been proposed. A first type of prior art hold-current controlling circuit is illustrated in FIG. 2A and a second type is illustrated in FIG. 2B. Further, a hold-current controlling circuit according to the present invention is depicted in FIG. 2C. FIGS. 3A, 3B and 3C are timing graphs which illustrate the operations of the circuits shown in FIGS. 2A, 2B and 2C, respectively.

In FIG. 2A, the memory cell array 11 is comprised of a large number of memory cells, however in FIG. 2A, only four memory cells 21-1*l*, 21-1*m*, 21-*n*/and 21-*nm* are illustrated. Since all of the memory cells have identical circuit arrangements only the memory cell 21-1*l* is illustrated in detail. As can be understood from the illustration of memory cell 21-1*l*, each of the memory cells is basically comprised of a flip-flop including a pair of multi-emitter transistors. One of the emitters of each transistor is connected to a pair of bit lines 14-1. The other emitter of each transistor is connected to a hold line 15-1. The flip-flop of a memory cell is thereby connected between respective word lines and hold lines. In the example of FIG. 2A, the memory cells 21-1*l* and 21-1*m* are connected between a word line 13-1 and the hold line 15-1. The word line 13-1 is connected to a word-driver transistor 22-1. The remaining word lines are also connected to respective word-driver transistors. These word-driver transistors 22-1 through 22-*n* are contained in the word decoder 12W (see FIG. 1). On the other hand, hold lines 15-1 through 15-*n* are connected to the hold-current source 16 (see FIG. 1) comprised of constant-current sources 23-1 through 23-*n*, connected to the hold lines 15-1 through 15-*n*, respectively. Each of the sources 23-1 through 23-*n* absorbs a constant current of Ih. The constant-current sources (23-1 through 23-*n*) cooperate with a hold-current controlling circuit 210. The circuit 210 has diodes 211-1 through 211-*n*. Each of the diodes 211-1 through 211-*n* is connected at its anode to a hold line 15-1 through 15-*n*, respectively, and, at its cathode, commonly to a constant-current source 212 which absorbs a constant current of $\Delta$Ih.

If, for example, the memory cell 21-1*l* is accessed by address data of the word decoder 12W (FIG. 1) and the bit decoder 12B (FIG. 1), first the word line 13-1 is driven by the word-driver transistor 22-1. Therefore, the word line 13-1 is held in the selection status. In this case, the voltage level $V_w$ of the word line 13-1 is "H" (high) as can be understood from FIG. 3A. In FIG. 3A, curves indicated by dotted lines, $30_{SN}$ and $30_{NS}$ are obtained, when the circuit 210 is not employed, and curves indicated by solid lines $31_{SN}$ and $31_{NS}$ are obtained, when the circuit 210 is employed. The curves $30_{SN}$ and $31_{SN}$ are obtained when a word line is changed from a selection status to a non-selection status. The curves $30_{NS}$ and $31_{NS}$ are obtained when another word line is changed from a non-selection status (N) to a selection status (S). Taking as an example the above-mentioned case, the word line 13-1 is changed from the selection status to the non-selection status (corresponding to the curve $30_{SN}$ or $31_{SN}$ of FIG. 3A). In this case, for example, a word line 13-*n* (FIG. 2A) is changed from a non-selection status to a selection status (corresponding to the curve $30_{NS}$ or $31_{NS}$ of FIG. 3A). When the circuit 210 of FIG. 2A is not employed, the crossing point between the curves $30_{SN}$ and $30_{NS}$ occurs at a time t0, as illustrated in FIG. 3A. It should be noted that data switching, from one of the memory cells of the word line 13-1 to one of the memory cells of the word line 13-*n*, occurs after the time t0. Accordingly, the time should be moved to the left in FIG. 3A so as to achieve high speed accessing of the desired memory cell. The hold-current controlling circuit 210 is useful for shifting the time t0 to a time t1. The reason for this is as follows. When the word line 13-1, is in a selection status, the voltage level of the word line 13-1 is "H" (high). Accordingly, the voltage level of the hold line 15-1 is also "H". In this case, electric charges are held by the stray capacitor distributed along the word line 13-1 and also by the parasitic capacitors formed in the memory cells 21-1*l* through 21-1*m*. After this, when the word line 13-1 is changed from a selection status to a non-selection status, the electric charges held in the above mentioned capacitors, must be discharged very quickly, via the hold line 15-1. If there is no circuit 210, the discharge current is absorbed only by the source 23-1. However, if the circuit 210 is employed, only the diode 211-1 becomes conductive, and the discharge current can be absorbed not only by the source 23-1, but also by the source 212 of the circuit 210. Thus, the sharp slope of the curve $31_{SN}$ of FIG. 3A can be obtained.

However, the circuit 210 has the following disadvantage which may be clarified with reference to FIG. 3A. That is, although it would be preferable for the slope of the curve $31_{NS}$ to be sharp the corresponding portion of the curve $31_{NS}$ becomes a gradual curve, due to the presence of the circuit 210. This is because, when the word line 15-*n* is changed from a non-selection status to a selection status, the charging current for charging the above-mentioned capacitors, is further absorbed by the constant-current source 212, via the diode 211-*n* which is now conductive. See the current $\Delta$Ih in FIG. 3A.

It should be noted that in order to shift the time (t0) as far as possible to the left (in FIG. 3A), the slope of the curve $30_{SN}$ must be very sharp and, at the same time, the slope of the curve $30_{NS}$ must also be very sharp.

FIG. 2B illustrates a circuit diagram of a part of a semiconductor memory circuit including a second type of a prior art hold-current controlling circuit 220. A memory circuit that utilizes this hold-current controlling circuit 220 can improve the memory accessing characteristic, compared to that of a memory circuit utilizing the afore-said circuit 210 of FIG. 2A. This improvement will be clarified with reference to FIG. 3B. In FIG. 3B, the crossing point between curves $32_{SN}$ and $32_{NS}$ occurs at a time t2 which is faster than the time t1 of FIG. 3A, due to the presence of the circuit 220. This is because the current (Ih+$\Delta$Ih), which is absorbed by the constant-current source 23-1 and a current source 221-1, flows until the time t2' which follows after the time t2. Since the current (Ih+$\Delta$Ih) continues flowing after the time t2, slope of the curve $32_{SN}$ becomes sharper than that of the curve $31_{SN}$ of FIG. 3A. However, the curve $32_{NS}$ is not improved, compared to the curve $31_{NS}$ of FIG. 3A.

The hold-current controlling circuit 220, especially one of the current sources 221-1 through 221-*n*, has already been disclosed in the publication of "1979 IEE International Solid-State Circuits Conference (ISSCC)/THURSDAY, Feb. 15, 1979/GRAND BALLROOM/11:45 A.M. (page 108)".

The operation of the current sources 221-1 through 221-*n* will now be described with reference to FIG. 2B. When the voltage level of the word line 13-1 is "H", the voltage levels at points A and B are also "H". After this, when the word line 13-1 is changed from a selection status to a non-selection status, the voltage level at the point A decreases to "L" (low). However, the voltage level at the point B still maintains the voltage level "H", because of the electric charges held at a capacitor $C_2$. Then the electric charges of the capacitor $C_2$ discharge through a resistor $R_2$ with a time constant $c2 \times r2$, where the symbols c2 and r2 represent the capacitance value of the capacitor $C_2$ and the resistance value of the resistor $R_2$, respectively. During the time the voltage level at the point B decreases towards "L", a transistor $T_3$ is conductive. Therefore, a current $\Delta$Ih continues flowing after the time t2 of FIG. 3B.

At the same time, the word line 13-*n* changes from a non-selection status to a selection status. In this case, the current source 221-*n* operates as follows. Since the circuit arrangement of the circuit 221-*n* is the same as the the circuit arrangement of the circuit 221-1, the following explanation will be made with reference to the circuit elements of the circuit 221-1, as illustrated in FIG. 2B. When the word line 13-n is in a non-selection status, the voltage levels of the points A and B are "L". After this, when the line 13-n changes from a non-selection status to a selection status, the voltage level at the point A increases to "H". Accordingly, a transistor $T_2$ becomes conductive. Then the capacitor $C_2$ is charged, and the voltage level at the point B increases toward "H". Accordingly, a transistor $T_3$ becomes conductive soon after the transistor $T_2$ becomes conductive. Therefore, a current $\Delta Ih$ continues to flow, via the transistor $T_3$, after the time t2. See the current $\Delta Ih$ of FIG. 3B. Consequently, the slope of the curve $32_{NS}$ (FIG. 3B) is gradual, compared to that of the curve $30_{NS}$. A transistor $T_1$ receives, at its base, a reference voltage $V_{ref}$, so as to supply a predetermined level of the voltage to the point A.

FIG. 2C depicts a circuit diagram of a part of a semiconductor memory circuit including a hold-current controlling circuit 230 of the invention of the present application. A memory circuit that utilizes the hold-current controlling circuit 230 can improve the memory accessing characteristic, compared to that of a memory circuit utilizing the aforesaid circuit 220 of FIG. 2B or circuit 210 of FIG. 2A. This improvement will be clarified with reference to FIG. 3C. In FIG. 3C, a cross point between curves $33_{SN}$ and $33_{NS}$ occurs at a time t3 which is prior to the time t2 of FIG. 3B, due to the presence of the circuit 230. This is because a current $(Ih+\Delta Ih)$, which is absorbed by the constant-current source 23-1 and the circuit 230, flows until the time t3' which follows after the time t3. Since the current $(Ih+\Delta Ih)$ continues flowing after the time t3, the slope of the curve $33_{SN}$ becomes sharper than that of the curve $31_{SN}$ of FIG. 3A. Further, the slope of the curve $33_{NS}$ becomes sharper than that of the curve $31_{NS}$ of FIG. 3A and the curve $32_{NS}$ of FIG. 3B. That is, the slope of the curve $33_{NS}$ is substantially the same as that of the desired curve $30_{NS}$.

The reason for the above mentioned improvement, according to the present invention, is derived from the fact that the current $\Delta Ih$ does not start flowing from a time t3, but from a time t3''. Since the current $\Delta Ih$ is not absorbed from the hold line 15-n, when the corresponding word line 13-n changes from a non-selection status to a selection status, the above-mentioned parasitic capacitors and the stray capacitor, which exist in the region including the word line 13-n and the memory cells of this line 13n, can be charged very quickly by a current supplied from a word-driver transistor 22-n, as illustrated in FIG. 2C.

The term t3'' can be freely preset by suitably selecting the capacitance values of capacitors $C_{11}$ through $C_{n1}$ of FIG. 2C and the resistance values of resistors $R_{11}$ through $R_{n1}$ of FIG. 2C. In FIG. 2C, each of the parallel circuits of the capacitors $C_{11}$ through $C_{n1}$ and the resistors $R_{11}$ through $R_{n1}$, is connected to Schottky transistors $ST_{11}$ through $ST_{n1}$, respectively. The emitters of the transistors $ST_{11}$ through $ST_{n1}$ are commonly connected to the constant-current source 212 (refer to FIG. 2A).

As can be understood from FIG. 2C, the circuit 230 of the present invention is very simple in construction, compared to that of the circuit 220 of FIG. 2B, and this is another advantage of the present invention. In particular, the number of capacitors and transistors are one-half the number used in the circuit 220.

Figure 4A:
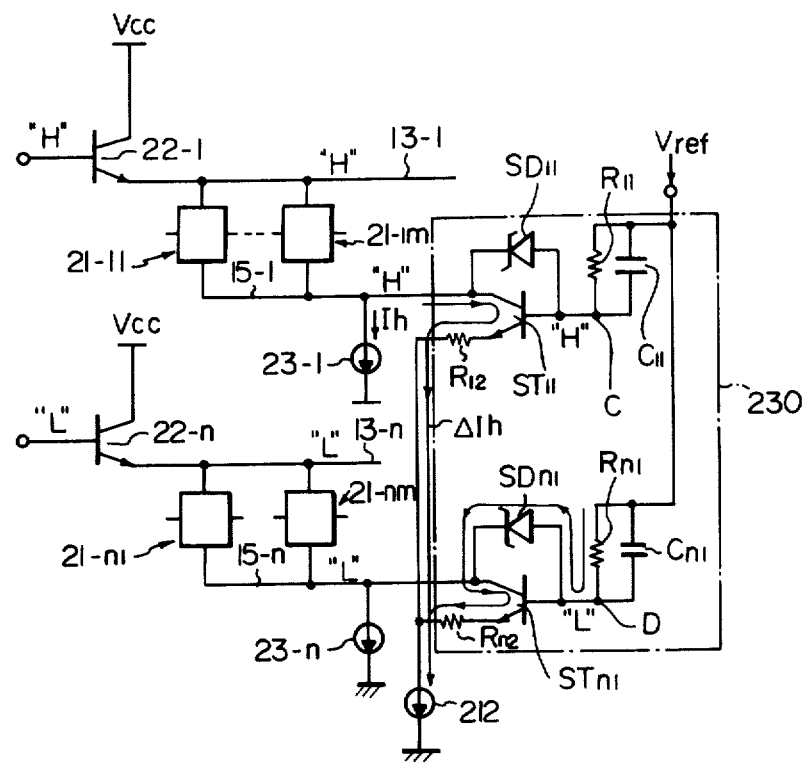
FIGS. 4A, 4B and 4C are circuit diagrams which illustrate the step-by-step operation of the hold-current controlling circuit illustrated in FIG. 2C.

The operation of the hold-current controlling circuit 230 will be explained with reference to FIGS. 4A, 4B and 4C. First, referring to FIG. 4A, when the word line 13-1 is in a selection status, the voltage level at the base of a transistor 22-1 is "H", and the voltage levels of the line 13-1 and the line 15-1 are also "H". Therefore, a Schottky diode $SD_{11}$ is inversely biased. Since the Schottky diode is contained in the Schottky transistor, the Schottky diode $SD_{11}$ is not illustrated in FIG. 2C, and further, it should be understood that if the transistor of the circuit 230 is made of a conventional transistor, a conventional diode must be inserted between the base and the collector of such usual transistor. In this case, the Schottky diode $SD_{11}$ is non-conductive, and the voltage level at a point C is "H". The level "H" is defined by the reference voltage $V_{ref}$. Since the voltage level at the point C is "H", the Schottky transistor $ST_{11}$ is conductive. Therefore, a current of full $\Delta Ih$ is absorbed by the constant-current source 212.

At the same time, the voltage level at the base of the transistor 22-n is "L", and the voltage levels of the line 13-n and the line 15-n are also "L". In this case, a Schottky diode $SD_{n1}$ is forwardly biased and a current $\Delta i$ flows from the voltage source $V_{ref}$ through the resistor $R_{n1}$ and the diode $SD_{n1}$. Accordingly, the voltage level at a point D is "L", and therefore the Schottky transistor $ST_{n1}$ is non-conductive. Since the current $\Delta i$ flows through the resistor $R_{n1}$, the magnitude of the current $\Delta i$ is far lower than that of the current $\Delta Ih$.

Figure 4B:
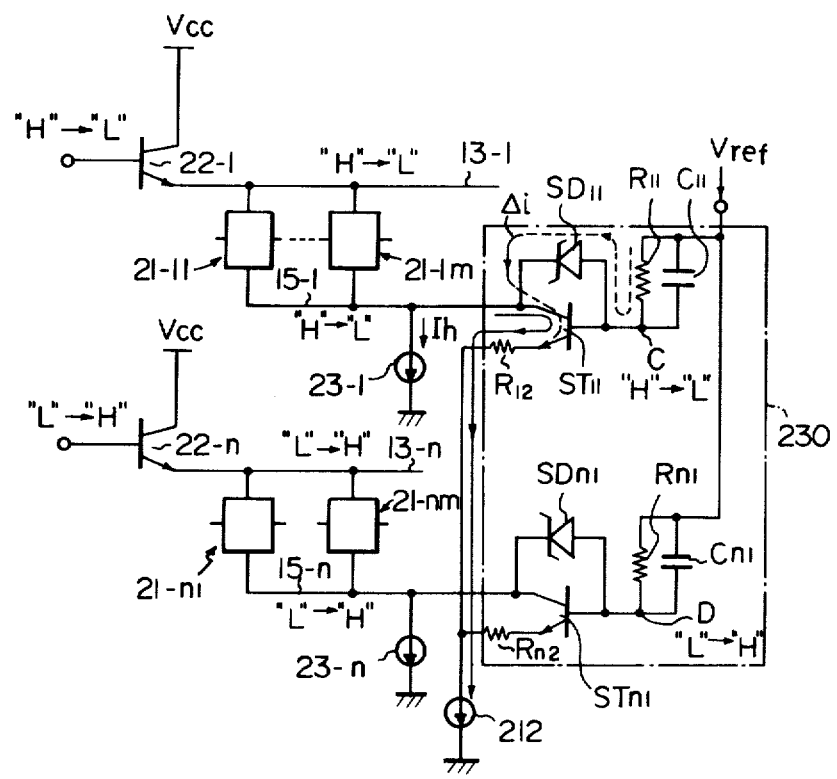

Next, referring to FIG. 4B, when the word 13-1 is changed from the selection status to the non-selection status, the word line 13-n is simultaneously changed from the non-selection status to the selection status. In this case, the voltage level at the base of the transistor 22-1 is changed from "H" to "L" and, accordingly, the voltage levels of the line 13-1 and the line 15-1 are changed from "H" to "L". In contrast, the voltage level at the base of the transistor 22-n is changed from "L" to "H" and, accordingly, the voltage level of the line 13-n and the line 15-n are changed from "L" to "H". In this case, the diode $SD_{11}$ is changed from an inversely biased mode to a forwardly biased mode, while, the diode $SD_{n1}$ is changed from the forwardly biassing mode to the inversely biassing mode. It is very important to take note to the following facts. During the time when the voltage level of the line 15-1 changes from "H" to "L", the diode $SD_{11}$ is conductive. In other words, the diode $SD_{11}$ becomes conductive for the first time after the voltage level of the line 15-1 decreases to $V_{ref}-V_f$ (where $V_f$ is the forward voltage of the diode). This is because, the level of the reference voltage $V_{ref}$ is selected to be the value which is slightly above the level of full "L" plus the forward voltage of the diode. For example, if the full "L" is $-1.6$ V and the forward voltage is 0.4 V, the reference voltage $V_{ref}$ may be, for example $-1.1$ V. Consequently, in FIG. 3C, the current $(Ih+\Delta Ih)$ flows until the time t3', which causes the curve $33_{SN}$ to have a sharp slope.

On the other hand, the diode $SD_{n1}$ does not quickly change from a conductive condition to a non-conductive condition, when the voltage level of the line 15-n changes from "L"→"H". This is because the voltage level at the point D changes very slowly from "L" to "H", due to the presence of the capacitor $C_{n1}$ and the resistor $R_{n1}$. Therefore, in FIG. 3C, the current $\Delta Ih$ is not absorbed from the line 15-n (FIG. 2C) during the interval from the time t3 to the time t3'', which causes a creation of the curve $33_{NS}$, as has substantially the same slope as the desired curve $30_{NS}$. The length of this said interval (t3-t3") can freely be determined by suitably selecting a time constant defined by both capacitors ($C_{11}$ through $C_{n1}$) and the resistors ($R_{11}$ through $R_{n1}$).

Figure 4C:
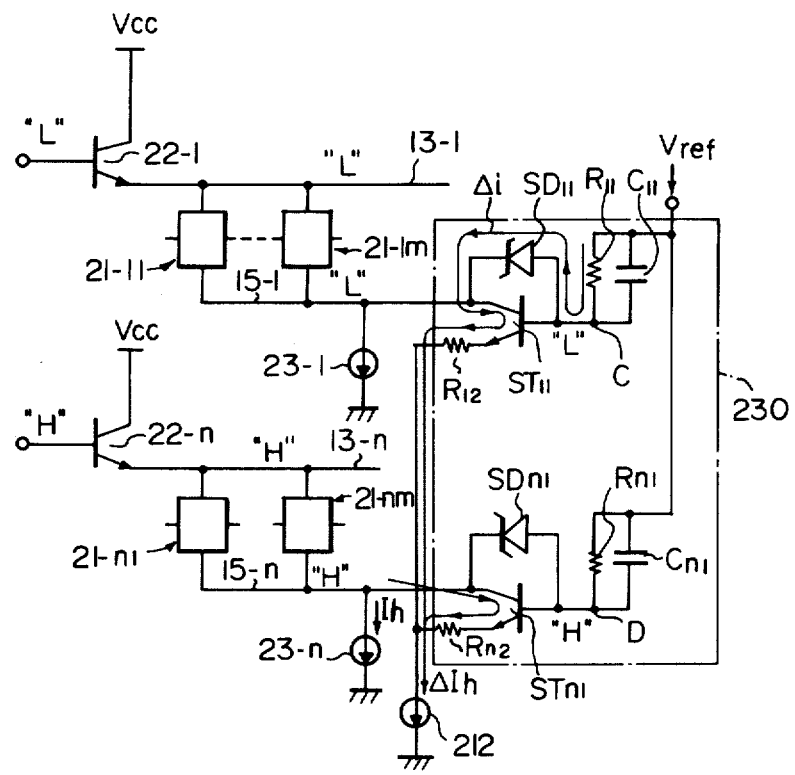

Finally, FIG. 4C illustrates the completion of data switching from a memory cell of the line 13-1 to a memory cell of the line 13-n. At this stage, the current $\Delta Ih$ flows through the transistor $ST_{n1}$ and the current $\Delta i$ flows through the diode $SD_{11}$. The voltage levels at the various portions are indicated by "H" or "L" in FIG. 4C, which mode is opposite to the mode illustrated in FIG. 4A.

As mentioned above, according to the present invention, a high speed memory accessing operation can be achieved.

I claim:

1. A semiconductor memory circuit comprising:
   memory cells;
   word lines, hold lines and bit lines connected to respective memory cells;
   a first constant-current source connected to said hold lines; and
   a hold-current controlling circuit connected to said first constant-current source;
   said hold-current controlling circuit comprising:
     identical controlling circuit elements connected to respective hold lines; and
     a second constant-current source commonly connected to said identical controlling circuit elements;
   each of said controlling circuit elements comprising means for absorbing electric charges from a respective hold line when a corresponding word line changes from a selection status to a non-selection status, until the voltage level of the respective hold line reaches a full "L" (low) level or full "H" (high) level and for blocking a flow of electric charges from said respective hold line when said corresponding word line changes from the non-selection status to the selection status, during a predetermined interval after a time data switching from one of said memory cells to another of said memory cells is performed, said blocking and absorbing means comprising:
     a parallel circuit of a resistor and a capacitor;
     a transistor having a base connected to said parallel circuit, at a first end, having a first output terminal connected to a respective hold line and having a second output terminal connected to said second constant-current source;
     a diode connected between said first output terminal and said base of said transistor; and
     a reference voltage $V_{ref}$ applied to a second end of said parallel circuit.

2. A circuit as set forth in claim 1, wherein both said transistor and said diode are formed, as one body, in a Schottky transistor.

3. A circuit as set forth in claim 1, wherein the level of said reference voltage $V_{ref}$ is selected to be a value which is slightly higher than the level of said full "L" or "H" level plus the forward voltage of said diode.

4. A circuit as set forth in claim 1, wherein the selected values of said capacitor and said resistor determine the length of said predetermined interval.

5. A semiconductor memory circuit comprising:
   memory cells arranged in rows and columns;
   word lines, one of which is connected to each row of memory cells;
   hold lines, one of which is connected to each row of memory cells;
   bit lines, two of which are connected to each column of memory cells;
   a first constant-current source connected to said hold lines; and
   a hold-current controlling circuit connected to said first constant-current source;
   said hold-current controlling circuit comprising;
     controlling circuit elements, one of which is connected to each of said hold lines; and
     a second constant-current source commonly connected to each of said controlling circuit elements;
   each of said controlling circuit elements comprising:
     a Schottky transistor having an emitter operatively connected to said second constant current source, having a collector connected to a respective one of the hold lines and to said first constant current source, and having a base;
     a resistor having a first terminal connected to the base of said Schottky transistor at a first node and having a second terminal; and
     a capacitor having a first terminal connected at said first node and having a second terminal connected to the second terminal of said resistor.

* * * * *